(12) United States Patent
Chen et al.

(10) Patent No.: US 8,772,831 B2
(45) Date of Patent: Jul. 8, 2014

(54) III-NITRIDE GROWTH METHOD ON SILICON SUBSTRATE

(75) Inventors: Chi-Ming Chen, Zhubei (TW); Po-Chun Liu, Hsinchu (TW); Hung-Ta Lin, Hsinchu (TW); Chin-Cheng Chang, New Taipei (TW); Chung-Yi Yu, Hsinchu (TW); Chia-Shiung Tsai, Hsinchu (TW); Ho-Yung David Hwang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 245 days.

(21) Appl. No.: 13/290,534

(22) Filed: Nov. 7, 2011

(65) Prior Publication Data

US 2013/0112939 A1    May 9, 2013

(51) Int. Cl.
*H01L 29/267*      (2006.01)
*H01L 29/778*      (2006.01)

(52) U.S. Cl.
USPC .... 257/191; 257/194; 257/615; 257/E29.246; 257/E33.027

(58) Field of Classification Search
USPC .................................. 257/E29.072
See application file for complete search history.

(56) References Cited

U.S. PATENT DOCUMENTS

| | | | |
|---|---|---|---|
| 2004/0219702 A1* | 11/2004 | Nagai et al. | 438/46 |
| 2008/0315255 A1 | 12/2008 | Maa et al. | |
| 2009/0159907 A1* | 6/2009 | Wang | 257/94 |
| 2010/0044719 A1* | 2/2010 | Yu et al. | 257/76 |

* cited by examiner

*Primary Examiner* — Stephen W Smoot
(74) *Attorney, Agent, or Firm* — Lowe Hauptman & Ham, LLP

(57) ABSTRACT

A circuit structure includes a substrate and a patterned dielectric layer over the substrate. The patterned dielectric layer includes a plurality of vias; and a number of group-III group-V (III-V) compound semiconductor layer. The III-V compound semiconductor layers include a first layer in the vias, a second layer over the first layer and the dielectric layer, and a bulk layer over the second layer.

22 Claims, 9 Drawing Sheets

III-NITRIDE GROWTH METHOD ON SILICON SUBSTRATE

TECHNICAL FIELD

This invention relates generally to semiconductor circuit manufacturing processes and more particularly to forming group-III group-V (III-V) compound semiconductor films on silicon substrate.

BACKGROUND

Group-III group-V compound semiconductors (often referred to as III-V compound semiconductors), such as gallium nitride (GaN) and its related alloys, have been under intense research in recent years due to their promising applications in electronic and optoelectronic devices. The large band gap and high electron saturation velocity of many III-V compound semiconductors also make them excellent candidates for applications in high temperature and high-speed power electronics. Particular examples of potential electronic devices employing III-V compound semiconductors include high electron mobility transistor (HEMT) and other heterojunction bipolar transistors. Particular examples of potential optoelectronic devices employing III-V compound semiconductors include blue light emitting diodes, laser diodes, and ultra-violet (UV) photo-detectors.

Epitaxially grown films of the III-V compound semiconductor GaN are used in these devices. Unfortunately GaN epitaxial films must be grown on substrates other than GaN because it is extremely difficult to obtain GaN bulk crystals due to the high equilibrium pressure of nitrogen at the temperatures typically used to grow bulk crystals. Owing to the lack of feasible bulk growth methods for GaN substrates, GaN is commonly deposited epitaxially on dissimilar substrates such as silicon, SiC and sapphire (Al$_2$O$_3$). Particularly, research is focused on using silicon as the growth substrate for its lower cost as compared to other growth substrates and subsequent processing capabilities. However, the growth of GaN films on silicon substrates is difficult because silicon has lattice constants and thermal expansion coefficients different than those of GaN.

The large stresses created by growing a GaN film on a silicon substrate may cause the substrate to bow or break. This bowing may cause several adverse effects. First, a great number of defects (dislocations) may be generated or propagated in the crystalline GaN films. Second, the thicknesses of the resulting GaN films will be less uniform; causing undesirable electrical property shifts in the final device. Third, large stressed GaN films may simply break. New methods for forming III-V compound semiconductor films while overcoming the above-discussed drawbacks are thus needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

A novel method for forming group-III to group-V (referred to as III-V hereinafter) semiconductor films and the resulting structures are provided. Throughout the description, the term "III-V compound semiconductor" refers to compound semiconductor materials comprising at least one group III element and one group-V element. The term "III-N compound semiconductor" refers to a III-V compound semiconductor in which the group V element is nitrogen. The stages of manufacturing an illustrative embodiment of the present invention are illustrated. Those skilled in the art will recognize that other manufacturing steps may take place before or after the described stages. Throughout the various views and illustrative embodiments of the present invention, like reference numbers are used to designate like elements.

If the difficulties of growing GaN films on silicon substrates could be overcome, silicon substrates would be attractive for GaN growth given their low cost, large diameter, high crystal and surface quality, controllable electrical conductivity, and high thermal conductivity. The use of silicon substrates would also provide easy integration of GaN based optoelectronic devices with silicon-based electronic devices. As discussed, growing a thick III-N film, up to a few microns, for example, 5 microns, has many challenges including mismatching CTE (coefficient of thermal expansion between the III-N material and silicon) and mismatching lattice constants. One previous solution uses several layers of slightly different material to reduce the stresses at the interface between the silicon wafer and the group III-V compound semiconductor layer. On top of the silicon wafer a thin nucleation layer may be grown. For example, an aluminum nitride (AlN) layer with a thickness of about 150-300 nm may be grown on the silicon wafer. On the nucleation layer a graded layer may be grown. In some cases, a graded layer would have a concentration gradient with reducing aluminum content and increasing gallium content. The graded layer may have a thickness of about 500 to 1000 nm with the top most gradient to be mostly gallium nitride. On the graded layer a bulk gallium nitride layer is deposited. The bulk gallium nitride layer can be deposited with less interfacial stress with the underlying layer; however, the bulk gallium nitride layer can only be deposited up to about 3 microns thick. A thicker bulk layer still results in breakage and excess defect.

Figure 1:
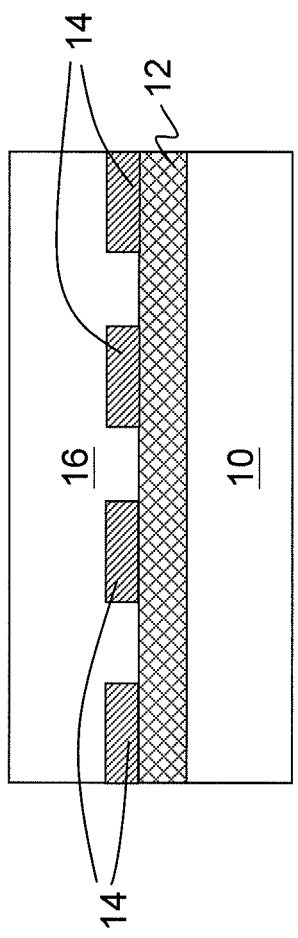
FIGS. 1 and 2 illustrate a prior art process for forming a group-III group-V semiconductor film.
Figure 2:
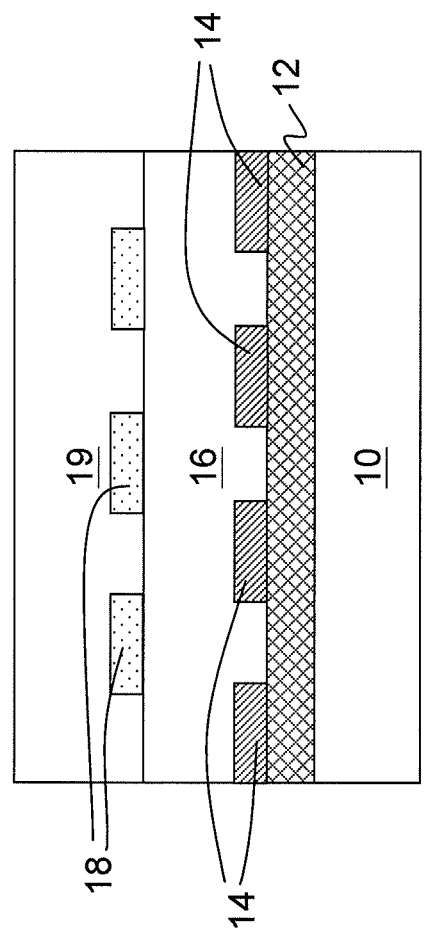

Another previous solution is the epitaxial lateral overgrowth (ELOG) technique. FIGS. 1 and 2 illustrate a conventional ELOG process. Referring to FIG. 1, substrate 10 is provided. Under-layer 12, which comprises a nitride semiconductor (i.e., a III-V compound semiconductor in which the group V element is nitrogen), such as GaN, is formed on substrate 10. Dielectric masks 14 are then formed on under-layer 12. Next, a III-V compound semiconductor layer 16 is epitaxially grown, wherein the growth includes a vertical growth component and a lateral overgrowth component, which eventually results in a continuous III-V compound layer 16. FIG. 2 shows an expansion of the ELOG technique, an additional mask layer 18 is formed, followed by the growth of another III-V compound layer 19. Again, the growth includes a vertical growth and a lateral growth, so that III-V compound layer 19 eventually becomes a continuous layer.

The ELOG techniques shown in FIGS. 1 and 2 suffer from drawbacks. First, in the silicon in the substrate may react with the nitrogen in under-layer 12 to form silicon nitride. The undesirably formed silicon nitride acts as an amorphous over-coat at the interface between silicon substrate 10 and under-layer 12. The amorphous overcoat may adversely affect the film quality of the subsequently grown III-V compound semi-conductor films because the silicon nitride has a higher resistivity. In addition, the higher resistivity may also preclude formation of vertical devices, in which two contacts to the device are formed on opposite sides of substrate 10. The two dielectric mask technique of FIG. 2 requires the epitaxial growth process to be performed twice, because the same epitaxial chamber cannot be used to deposit and pattern the second dielectric mask. Thus wafer in process is heated and cooled two or more times, which heightens the CTE mis-match.

Figure 3:
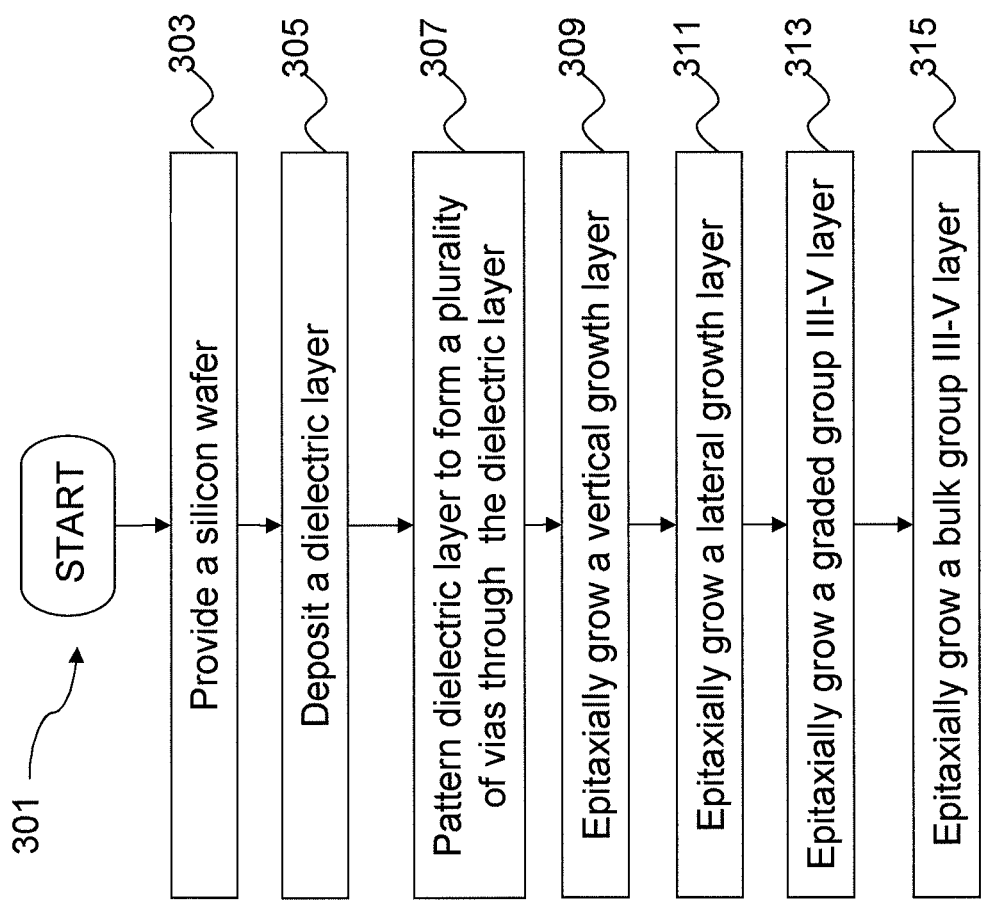
FIG. 3 is a process flow diagram showing operations in accordance with various embodiments of the present disclosure; and, FIGS. 4A through 4G are cross-sectional views of stages in the manufacturing of various embodiment in accordance with the present disclosure.

The present disclosure provides a structure and a method to form III-V compound semiconductor films with less strain and thereby increasing the yield and reducing defects. Refer-ring now to FIG. 3, the flowchart of the method 301, at operation 303, a first silicon wafer is provided. The silicon wafer may have a crystal orientation having a Miller index of [111]. The silicon wafer may be between about 600 to about 1500 microns thick. A thicker silicon wafer may be stronger and is less likely to break; however, the increased volume increases the bowing when the wafer is cooled. A thinner silicon wafer would suffer less bowing, but is less strong.

Figure 4A:
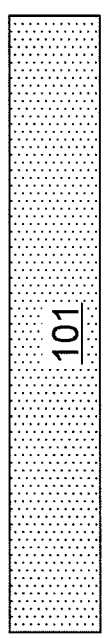
Figure 4B:
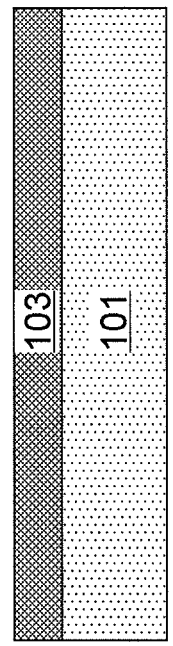

In operation 305 of FIG. 3, a dielectric layer is deposited. FIG. 4B shows a substrate 101 with dielectric layer 103 deposited thereon. The dielectric layer may be about 100 to 1000 nm thick. The dielectric layer may be a silicon oxide, a silicon nitride, a silicon oxynitride, or another dielectric material that is selective against epitaxial growth. In one example, the dielectric layer is a silicon oxide deposited using thermal oxidation, plasma enhanced chemical vapor deposition (PECVD), or high density plasma CVD (HDPCVD).

Figure 4C:
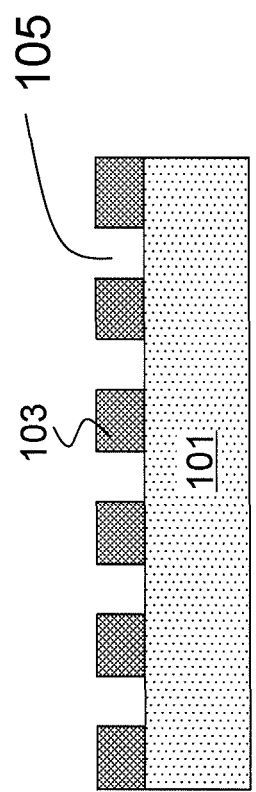

In operation 307, the dielectric layer is patterned to form a plurality of vias through the dielectric layer. The patterning process includes a deposition of photoresist, forming the via pattern in the photoresist using lithographic techniques, removing the portion of the photoresist above the via, and etching the vias through to the silicon wafer. FIG. 4C shows the dielectric layer 103 with vias 105 formed therein. Note that the vias expose the underlying silicon wafer 101.

Figure 4D:
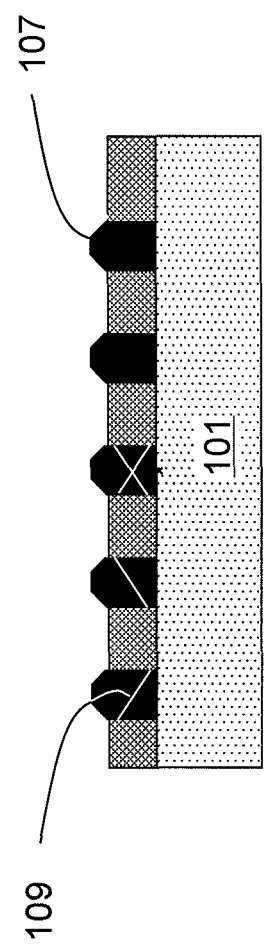

In operation 309 of FIG. 3, a vertical growth layer is epi-taxially grown in the vias. Generally, the vertical growth layer fills the vias completely, with some portions of the vertical growth layer outside of the vias. In other words, portions of the vertical growth layer may be thicker than the dielectric layer. However, some portion of the vertical growth layer may be less thick than the dielectric layer. Because of the crystal orientation of the silicon wafer and the vertical growth layer, dislocations within the vertical growth layer are expected to propagate with a sidewise component, as shown in FIG. 4D. Thus with proper tuning of the aspect ratio of the via, most or all of the dislocations 109 would end at the sidewall of the vias 107 and would not propagate into a bulk epitaxial film outside of the vias 107. In certain embodiments, the vertical growth layer is grown using a low temperature epitaxial process. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HYPE), chloride vapor-phase epitaxy (Cl-VPE), and liquid phase epitaxy (LPE). The process temperature may be about 650 to about 950 degrees Celsius. The pressure may be greater than about 300 Torr. The vertical growth layer may be an aluminum nitride layer with a thickness that is the same as the dielectric layer or just, above the dielectric layer.

Figure 4E:
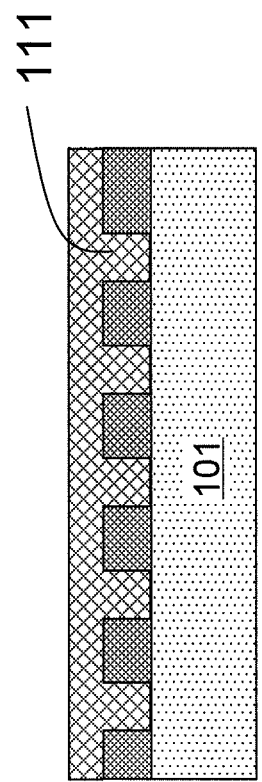

Referring back to FIG. 3, in operation 311, a lateral growth layer is grown. FIG. 4E shows the lateral growth layer 111, which is generally the same material as the vertical growth layer. In certain embodiments, the lateral growth layer and the vertical growth layer are both aluminum nitride.

During the lateral growth operation 311, the aluminum nitride, for example, is grown laterally under a different set of the process conditions from that of the vertical growth opera-tion 309. The process temperature may be about 1000 to about 1200 degrees Celsius. The pressure may be between about 10 Torr to about 300 Torr. The lateral growth layer continues the vertical growths from different vias and connects them to form a continuous layer. The lateral growth continues until a continuous film is formed, and may be about 50 nm to about 300 nm thick, for example, less than about 100 nm thick. The lateral growth layer is relatively free of vertical defects because the defects do not propagate past the sidewalls of the vias, as shown in FIG. 4D. The defects in the lateral growth layer have been found to be reduced. Experimental results show that the defect density in the lateral growth layer may be $1E8/cm^2$ or below.

The vertical growth layer and the lateral growth layer may be formed in the same chamber or in separate chambers. In one chamber, the vertical growth process can be set for a first vertical growth layer formation. Because the process tem-peratures are much higher during the lateral growth phase, the chamber would have to be heated before the lateral growth layer is formed. If two chambers are used, it may be possible to transfer the wafer-in-process while it is kept at a relative high temperature without significantly cooling the wafer-in-process between chambers.

Figures 5A, 5B:
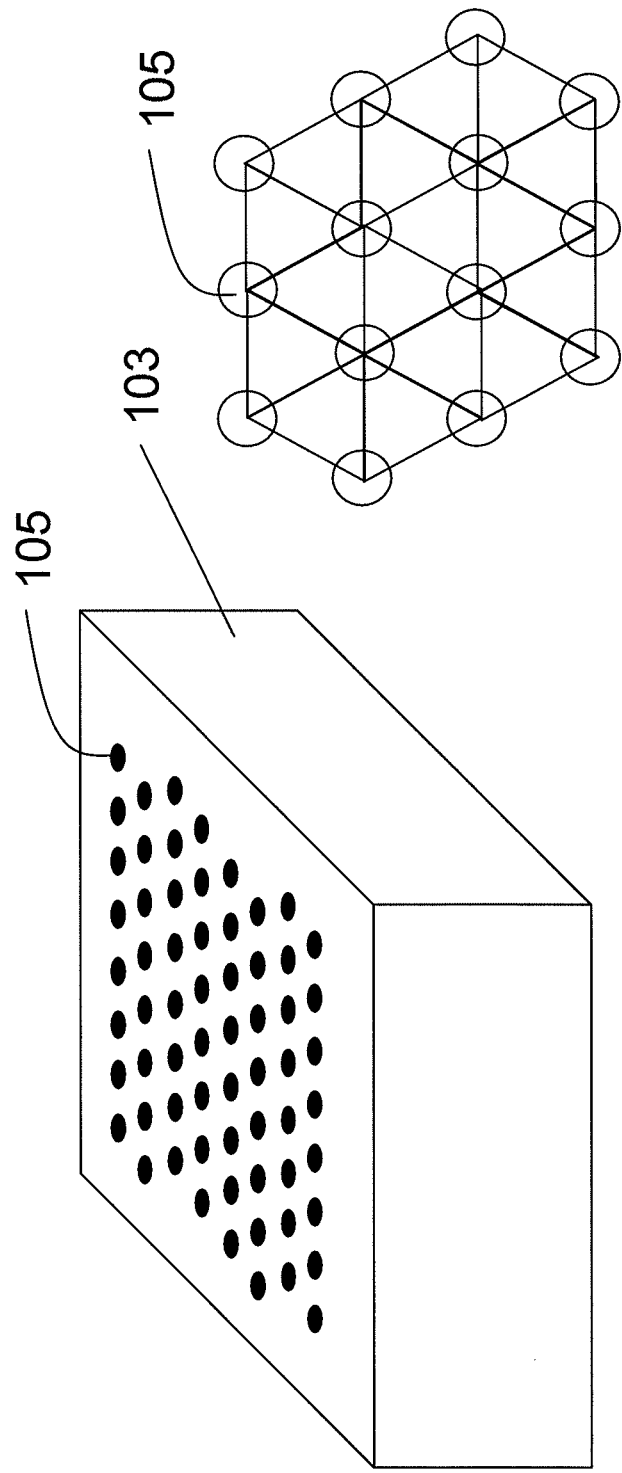
FIGS. 5A and 5B are cross-sectional views of circuit structure products in accordance with various embodiments of the present disclosure.

According to various embodiments, a specific via pattern is used so that the lateral growth layer becomes a continuous film. FIGS. 5A and 5B depict the dielectric layer 103 and the patterns of the vias 105. The vias have a substantially hex-agonal or honeycomb arrangement. That is, each via except for the edge vias has 6 adjacent vias that are roughly equidis-tant center to center. The hexagonal arrangement is shown in FIG. 5B. The vias may be cylindrical with a roughly circular opening. The vias may also have roughly rectangular open-ings or hexagonal openings having a same effective diameter as the cylindrical via.

According to these embodiments, each via in the hexago-nal arrangement has an aspect ratio of about 2 to about 5, defined as a via height divided by an effective diameter. Each via in an arrangement may be separated from its neighbor between about 2 to about 5 microns, edge to edge. Depending on the via height, the effective diameter of the via may be about 200 nm to about 5000 nm while staying within the range of aspect ratios that can reduce vertical dislocations. The vias may have vertical sidewalls or slightly sloping side-walls. Sloping sidewalls may occur by design or due to the etching process used to form the vias.

In one example, the vias are cylinders having a height about 400 nm, a diameter at about 150 nm. The vias are separated by about 2 microns edge to edge. In this example, the vertical growth direction is the [111] orientation of the silicon wafer; and the lateral directions are [11−2] and [−110].

While other types of arrangements may be used, for example, a tetragonal arrangement. A tetragonal arrangement would require different via spacing, for example, the vias should be spaced closer together so that the lateral growth layer can be made continuous.

Figure 4F:
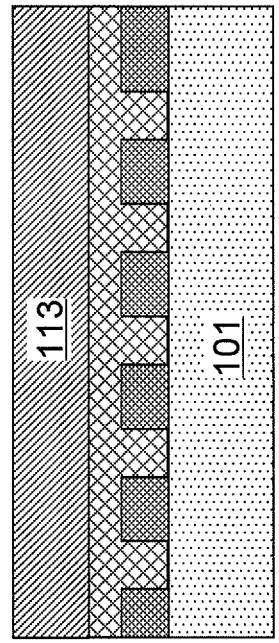

Referring back to FIG. 3, in operation 313, a graded group III-V layer is epitaxially grown. The graded group III-V layer is mostly defect free and shown as layer 113 in FIG. 4F. The graded group III-V layer may have a thickness about 0.5 microns to about 3 microns. In one example, the graded group III-V layer has a thickness of about 2 microns.

According to various embodiments, the graded group III-V layer may be a superlattice layer with AlGaN and Al(Ga)N superlattices. The concentrations in the Al(Ga)N superlattice may be defined as $Al_x(Ga_{1-x})N$, with the x value greater than about 0.8 and up to 1. Thus, the Al(Ga)N superlattice may have an x value of 1 so that the superlattice is simply AlN. The superlattice layer may be formed by alternating an Al(Ga)N layer of about 3-8 nm thick, or about 5 nm, for example, and a GaN layer of about 10-30 nm thick, or about 20 nm, for example.

In some cases, the gallium concentration may increase from one side of the graded layer to the other side. In other words, the Al(Ga)N superlattice closest to the AlN lateral growth layer would have little or no gallium concentration, and the Al(Ga)N superlattice closest to the top of the graded layer would have little or no aluminum. A superlattice layer may be formed using metal organic CVD (MOCVD) or metal organic vapor phase epitaxy (MOVPE), molecular beam epitaxy (MBE), atomic layer deposition (ALD), electron-gun, or sputtering methods.

In other embodiments, layer 113 may be a graded layer having increasing concentrations of gallium and decreasing concentrations of aluminum from the lateral growth layer side to the bulk gallium nitride side. The concentration variation may be gradual or stepwise in several layers. During epitaxial growth, the concentration variation may be achieved by switching on and off various gases and changing flow rates and pressures without removing the wafer-in-process from the chamber. The use of layer 113 is found to reduce the CTE mismatch between the bulk gallium nitride and the silicon wafer.

Figure 4G:
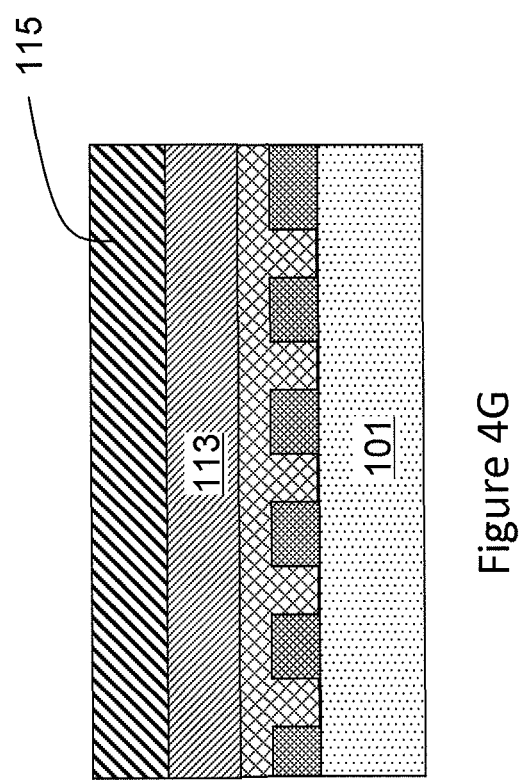

Referring back to FIG. 3, in operation 315, a bulk group III-V layer is epitaxially grown. The bulk group III-V layer is shown as layer 115 in FIG. 4G. The bulk group III-V layer may be a gallium nitride (GaN) layer with a thickness of between about 0.5 microns and about 3 microns, or between about 1 micron and 5 microns, for example, at about 3 microns. The bulk GaN layer is grown under high temperature conditions. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HYPE), chloride vapor-phase epitaxy (Cl-VPE), and liquid phase epitaxy (LPE). Using metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiary-butylamine (TBAm), phenyl hydrazine, or other suitable chemical.

Figure 6A:
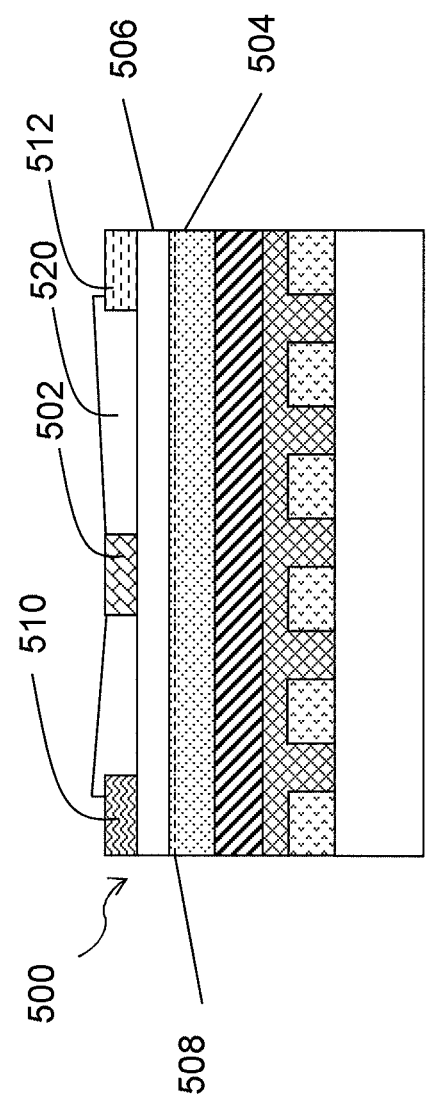
FIG. 6A is a cross-sectional view of a power transistor device in accordance with various embodiments of the present disclosure.

Depending on the device to be manufactured, the bulk GaN may be doped or undoped. FIG. 6A shows an example power transistor device 500 according to various embodiments of the present disclosure. The power transistor device 500 is formed on a silicon substrate, which may have a crystal lattice orientation of [111]. The bulk gallium nitride layer 504 is a channel layer for the power transistor device, which may be a high electron mobility transistor (HEMT). FIG. 6A shows an active layer 506 on top of the bulk GaN layer. The active layer 506, also referred to as donor-supply layer, is grown on the channel layer 504. An interface is defined between the channel layer 504 and the donor-supply layer 506. A carrier channel 508 of two-dimensional electron gas (2-DEG) is located at the interface. In at least one embodiment, the donor-supply 506 refers to an aluminum gallium nitride (AlGaN) layer (also referred to as the AlGaN layer 506). The AlGaN layer 506 can be epitaxy grown on the GaN layer 504 by MOVPE using aluminum-containing precursor, gallium-containing precursor, and nitrogen-containing precursor. The aluminum-containing precursor includes trimethylalluminum (TMA), triethylaluminum (TEA), or other suitable chemical. The gallium-containing precursor includes TMG, TEG, or other suitable chemical. The nitrogen-containing precursor includes ammonia, TBAm, phenyl hydrazine, or other suitable chemical. The AlGaN layer 506 has a thickness in a range from about 5 nanometers to about 50 nanometers. In other embodiments, the donor-supply layer 506 may include an AlGaAs layer, or AlInP layer.

The band gap discontinuity exists between the AlGaN layer 506 and the GaN layer 504. The electrons from piezoelectric effect in the AlGaN layer 506 drop into the GaN layer 504, creating a very thin layer 508 of highly mobile conducting electrons in the GaN layer 504. This thin layer 108 is referred to as a two-dimensional electron gas (2-DEG), forming a carrier channel (also referred to as the carrier channel 508). The thin layer 508 of 2-DEG is located at an interface of the donor-supply layer 506 and the GaN layer 504. Thus, the carrier channel has high electron mobility because the GaN layer 504 is undoped or unintentionally doped, and the electrons can move freely without collision with the impurities or substantially reduced collision.

The semiconductor structure 500 also includes a source feature 510 and a drain feature 512 disposed on the donor-supply layer 506 and configured to electrically connect to the carrier channel 508. Each of the source feature and the drain feature comprises a corresponding intermetallic compound. The intermetallic compound is at least partially embedded in the donor-supply layer 506 and a top portion of the channel layer 504. In one example, the intermetallic compound comprises Al, Ti, or Cu. In another example, the intermetallic compound comprises AlN, TiN, $Al_3Ti$ or $AlTi_2N$.

The intermetallic compound may be formed by constructing a pattern metal layer in a recess of the donor-supply layer 506. Then, a thermal annealing process may be applied to the pattern metal layer such that the metal layer, the donor-supply layer 506 and the GaN layer 504 react to form the intermetallic compound. The intermetallic compound contacts the carrier channel 508 located at the interface of the donor-supply layer 506 and the GaN layer 504. Due to the formation of the recess in donor-supply layer 506, the metal elements in the intermetallic compound may diffuse deeper into the donor-supply layer 506 and the GaN layer 504. The intermetallic compound may improve electrical connection and form ohmic contacts between the source/drain features and the carrier channel 508. In one example, the intermetallic compound is formed in the recess of the donor-supply layer 506 thereby the intermetallic compound has a non-flat top surface.

In another example, intermetallic compound overlies a portion of the donor-supply layer 506.

The semiconductor structure 500 also includes a gate 502 disposed on the donor-supply layer 506 between the source and drain features. The gate 502 includes a conductive material layer which functions as the gate electrode configured for voltage bias and electrical coupling with the carrier channel 508. In various examples, the conductive material layer may include a refractory metal or its compounds, e.g., tungsten (W), titanium nitride (TiN) and tantalum (Ta). In one example, the gate 502 is directly disposed on the donor-supply layer 506. In another example, a dielectric layer (not shown) is formed between the gate 502 and the donor-supply layer 506. The dielectric layer may include silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$) or hafnium oxide ($HfO_2$). The dielectric layer has a thickness in a range from about 3 nm to about 500 nm. The dielectric layer provides isolation to prevent gate leakage and further improve device switching speed.

The semiconductor structure 500 also includes an insulating layer 520 disposed between gate 502 and the source/drain features (namely the intermetallic compound). The insulating layer 520 covers the source/drain features and exposes a portion of the source/drain features to form functional circuitry. The gate 502 is at least partially embedded in the insulating layer 520.

The HEMT 500 includes a relatively thick layer of bulk gallium nitride, which allows high power operation with voltages greater than a hundred volts. The channel has very low resistivity, which allows very high frequency operation. Electrical properties of gallium nitride based HEMT compared favorably to silicon and silicon carbide based devices and with very competitive costs. Specifically, low gate capacitance and low on-resistance permits much higher frequency switching converters than competing silicon-based transistors. The present disclosure provides a structure and method to form the thick gallium nitride layer with less strain and defects.

Figure 6B:
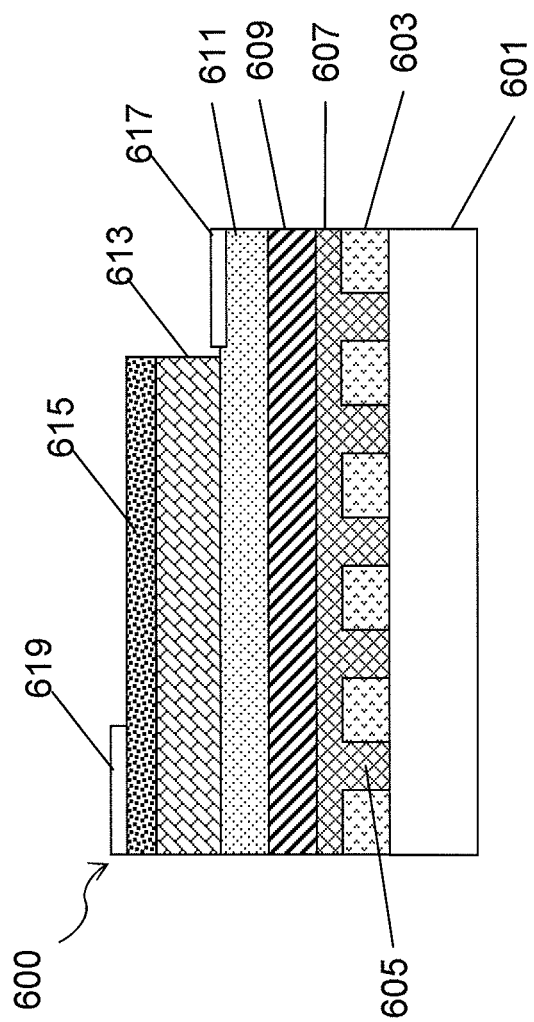
FIG. 6B is a cross-sectional view of a light emitting diode in accordance with various embodiments of the present disclosure.

Various embodiments of the present disclosure also pertain to a light-emitting diode (LED) as shown in FIG. 6B. The LED 600 is formed on a silicon substrate 601, which may have a crystal lattice orientation of [111]. On the silicon substrate is the patterned layer 603. The deposition and patterning operations for the patterned layer 603 is as disclosed in conjunction with operations 305 and 307 of FIG. 3. For vertical devices, it may be advantageous to use conductive materials instead of dielectric material for layer 603, so that patterned layer 603 also has the function of conducting carriers in vertical optoelectronic devices, in which the two contacts are formed on opposite sides of substrate. However, the material of layer 603 is resistant to epitaxial growth.

A vertical growth layer 605 of group III-V semiconductor material, for example, AlN, is embedded in the patterned layer 603. A lateral growth layer 607 is grown over the vertical growth layer 605 and completely covers the patterned layer 603 so as to form a continuous epitaxial film. Next, a graded group III-V layer 609, for example, AlGaN film, or a group III-V superlattice layer 609, for example, Al(Ga)N superlattice layer, is formed over the lateral growth layer, as described in association with operation 313 of FIG. 3. Over the graded group III-V group layer, a bulk III-V layer 611 is grown, for example, gallium nitride film. Depending on the type of LED, the bulk gallium nitride film 611 is either n-doped or p-doped. Doped gallium nitride film is grown by adding dopants during epitaxial growth. The type of dopant and concentration determines the amount of doping. The bulk gallium nitride layer for an LED may have different requirements than the bulk gallium nitride layer for a HEMT. In addition to difference in doping, thickness of the bulk gallium nitride film used in the respective devices are also different.

On the doped gallium nitride layer, the multiple quantum well (MQW) layer 613 is formed including alternating (or periodic) layers of active material. Depending on the LED color to be emitted during operation, different materials are included in these alternating layers, for example, gallium nitride and indium gallium nitride for a blue LED. In one embodiment, the MQW layer 613 includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency of the structure depends on the number of layers of alternating layers and thicknesses. The thickness of the MQW layer 613 may be about 10-2000 nm, about 100-1000 nm, or for example, about 100 nm.

Another doped group III-V layer 615 is formed on the MWQ layer 613. This doped layer has an opposite doped conductivity from the doped bulk gallium nitride film 611. The MQW layer 613 and the doped layer 615 are patterned and etched down to or into the doped bulk gallium nitride layer 611 to define an area for the contact pad 617. Note that an isolating material may be added between the MQW sidewall and the contact pad 617 so as to electrically separate them. If the bulk gallium nitride layer 611 has n-type doped conductivity, then the contact pad 617 is an n-type contact. If the bulk gallium nitride layer has p-type conductivity, then the contact pad 617 is a p-type contact. Additional layers of material may be added over the doped layer 615 before the other contact pad 619 is formed. Both contact pads 617 and 619 may be made of one or several layers of metal and other conductive material. In some LEDs, wires are bonded to the contact pads from external terminals. When voltage is applied via the wires between the contact pads, the LED emits light. Other contact methods include metal bonding and flip chip bonding. In other embodiments, the contacts are formed on opposite sides of the LED in a vertical chip formation. In the vertical chip formation, the contacts may be metal bonded, soldered, or wire bonded to terminals connected to the electricity source.

The embodiments of the present invention may have other variations. For example, one or more layers of III-V compound semiconductor layers may be formed to further improve the quality of the resulting III-V compound semiconductor layers or the patterned layer may include more than one layer. Certain embodiments of the present disclosure have several advantageous features. By separately growing the vertical growth layer and the lateral growth layer in some circumstances, very different process conditions may be used. The vertical growth results in the generation of fewer vertical dislocations in the lateral growth layer. The use of the patterned layer and superlattice layer also reduce lattice mismatch strain. Hence the quality of the III-V compound semiconductor layers is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit structure comprising:
   a silicon substrate;
   a patterned dielectric layer over and in direct contact with a top surface of the silicon substrate, the patterned dielectric layer comprising a plurality of vias through the dielectric layer;
   a vertical growth layer disposed over the substrate and within the vias in the patterned dielectric layer;
   a lateral growth layer of group-III to group-V (III-V) compound semiconductor layer disposed over the vertical growth layer and the patterned dielectric layer, forming a continuous layer over the patterned dielectric layer and the vertical growth layer; and
   a graded group III-V superlattice layer over the lateral growth layer.

2. A circuit structure comprising:
   a silicon substrate;
   a patterned dielectric layer over and in direct contact with a top surface of the silicon substrate, the patterned dielectric layer comprising a plurality of vias through the dielectric layer, said plurality of vias arranged in a hexagonal pattern;
   a vertical growth layer disposed over the substrate and within the vias in the patterned dielectric layer;
   a lateral growth layer of group-III to group-V (III-V) compound semiconductor layer disposed over the vertical growth layer and the patterned dielectric layer, forming a continuous layer over the patterned dielectric layer and the vertical growth layer;
   a graded group III-V superlattice layer over the lateral growth layer; and
   a bulk layer of group III-V compound semiconductor layer over the lateral growth layer.

3. The circuit structure of claim 2, wherein the patterned dielectric layer is a thermal silicon oxide layer.

4. The circuit structure of claim 2, wherein the vertical growth layer and the lateral growth layer consist essentially of a same material.

5. The circuit structure of claim 2, wherein the vias have an aspect ratio of about 2 to about 5.

6. The circuit structure of claim 5, wherein each via is separated from an adjacent via by about 2 microns to about 5 microns.

7. The circuit structure of claim 5, wherein each via is about 3000 angstroms to about 5000 angstroms deep.

8. The circuit structure of claim 5, wherein each via has a diameter of about 1000 angstroms to about 2000 angstroms.

9. The circuit structure of claim 5, wherein a size and spacing of the plurality of vias varies across the patterned dielectric layer.

10. The circuit structure of claim 2, wherein the bulk layer is about 0.5 to about 3 microns thick.

11. The circuit structure of claim 2, wherein the circuit structure is a light emitting diode.

12. The circuit structure of claim 2, wherein the circuit structure is a high electron mobility transistor.

13. A high electron mobility transistor comprising:
    a silicon substrate;
    a patterned dielectric layer over and directly contacting a top surface of the silicon substrate, the patterned dielectric layer comprising a plurality of vias through the dielectric layer, said plurality of vias each having hexagonal openings;
    a vertical growth layer disposed over the substrate and within the vias in the patterned dielectric layer;
    a lateral growth layer of group-III to group-V (III-V) compound semiconductor layer disposed over the vertical growth layer and the patterned dielectric layer, forming a continuous layer over the patterned dielectric layer and the vertical growth layer;
    a graded group III-V superlattice layer over the lateral growth layer; and
    a bulk layer of group III-V compound semiconductor layer over the lateral growth layer.

14. The high electron mobility transistor of claim 13, wherein the silicon substrate has a crystal orientation of [111].

15. The high electron mobility transistor of claim 13, wherein the patterned dielectric layer is a thermal silicon oxide layer.

16. The high electron mobility transistor of claim 13, wherein the vertical growth layer and the lateral growth layer consist essentially of a same material.

17. The high electron mobility transistor of claim 13, wherein the vias have an aspect ratio of about 2 to about 5.

18. The high electron mobility transistor of claim 17, wherein each via is separated from an adjacent via by about 2 microns to about 5 microns.

19. The high electron mobility transistor of claim 17, wherein each via is about 3000 angstroms to about 5000 angstroms deep.

20. The high electron mobility transistor of claim 17, wherein each via has a diameter of about 1000 angstroms to about 2000 angstroms.

21. The high electron mobility transistor of claim 13, wherein each via has slanted sidewalls.

22. The high electron mobility transistor of claim 13, wherein the bulk layer is about 05 to about 3 microns thick.

* * * * *